United States Patent
Chen et al.

(10) Patent No.: US 9,007,116 B2
(45) Date of Patent: Apr. 14, 2015

(54) UP-CONVERSION MIXER HAVING A REDUCED THIRD ORDER HARMONIC

(71) Applicant: Taiwan Semiconductor Manufacturing Company, Ltd., Hsinchu (TW)

(72) Inventors: Huan-Neng Chen, Shalu Township (TW); Ying-Ta Lu, Fanlu Township (TW); Mei-Show Chen, Hsinchu (TW); Chewn-Pu Jou, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/062,927

(22) Filed: Oct. 25, 2013

(65) Prior Publication Data
US 2014/0049309 A1 Feb. 20, 2014

Related U.S. Application Data

(63) Continuation of application No. 13/084,885, filed on Apr. 12, 2011, now Pat. No. 8,593,206.

(51) Int. Cl.
G06F 7/44 (2006.01)
G06G 7/16 (2006.01)
H03D 7/14 (2006.01)
H04L 27/04 (2006.01)

(52) U.S. Cl.
CPC .............. *G06G 7/16* (2013.01); *H03D 7/1441* (2013.01); *H03D 7/1458* (2013.01); *H03D 7/1491* (2013.01); *H03D 2200/0019* (2013.01); *H04L 27/04* (2013.01)

(58) Field of Classification Search
USPC ................ 327/356, 357, 359; 455/333
See application file for complete search history.

(56) References Cited

U.S. PATENT DOCUMENTS

| | | | |
|---|---|---|---|
| 5,589,791 A * | 12/1996 | Gilbert .................... | 327/359 |
| 6,566,951 B1 | 5/2003 | Merrigan et al. | |
| 7,095,799 B2 * | 8/2006 | Braithwaite ............. | 375/296 |
| 7,218,163 B2 | 5/2007 | Hanke et al. | |
| 7,450,913 B2 * | 11/2008 | Friedrich et al. ......... | 455/114.3 |
| 7,514,981 B2 | 4/2009 | Yang et al. | |
| 7,973,587 B2 | 7/2011 | Yang et al. | |
| 8,593,206 B2 * | 11/2013 | Chen et al. ............... | 327/356 |
| 2003/0114129 A1 | 6/2003 | Jerng | |
| 2003/0236083 A1 | 12/2003 | Wiklund et al. | |
| 2004/0024658 A1 | 2/2004 | Carbone et al. | |
| 2005/0277389 A1 | 12/2005 | Friedrich et al. | |

OTHER PUBLICATIONS

Youn, Y. S. et al., "A 2GHz 16dBm IIP3 Low Noise Amplifier in 0.25 μm CMOS Technology", IEEE Int. Solid-State Circuits Conf., San Francisco, CA, pp. 452-453, Feb. 2003.

* cited by examiner

*Primary Examiner* — Kenneth B. Wells
(74) *Attorney, Agent, or Firm* — Lowe Hauptman & Ham, LLP

(57) ABSTRACT

An up-conversion mixer includes a mixer cell having at least one output node configured to generate an output. The up-conversion mixer further includes a first cascaded transconductance input stage coupled to the mixer cell, the first cascaded transconductance input stage configured to receive an input signal and to reduce a third order harmonic of the output. The up-conversion mixer further includes a second cascaded transconductance input stage coupled to the mixer cell, the second cascaded transconductance input stage configured to receive the input signal and to reduce a third order harmonic of the output.

20 Claims, 8 Drawing Sheets

UP-CONVERSION MIXER HAVING A REDUCED THIRD ORDER HARMONIC

PRIORITY CLAIM

The present application is a continuation of U.S. application Ser. No. 13/084,885, filed Apr. 12, 2011, which issued as U.S. Pat. No. 8,593,206 on Nov. 26, 2013, and is incorporated by reference herein in its entirety.

TECHNICAL FIELD

The present disclosure relates generally to an integrated circuit and more particularly an up-conversion mixer.

BACKGROUND

An up-conversion mixer is used in many communication applications, e.g., in a single-side band (SSB) communication system. The up-converted signal has an up-conversion term at the local oscillator frequency ($f_{LO}$) plus the baseband signal frequency ($f_{BB}$), i.e., at ($f_{LO}+f_{BB}$), and a third order harmonic term at ($f_{LO}-3f_{BB}$). A third order distortion suppression $P_{3d}$=P($f_{LO}+f_{BB}$)−P($f_{LO}-3f_{BB}$), which is the difference of output power between the up-converted signal and the third order harmonic term, is an important factor for a transmitter, e.g., in a Global System for Mobile Communications (GSM). With increasing input power, the third order distortion suppression becomes worse (decreases).

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
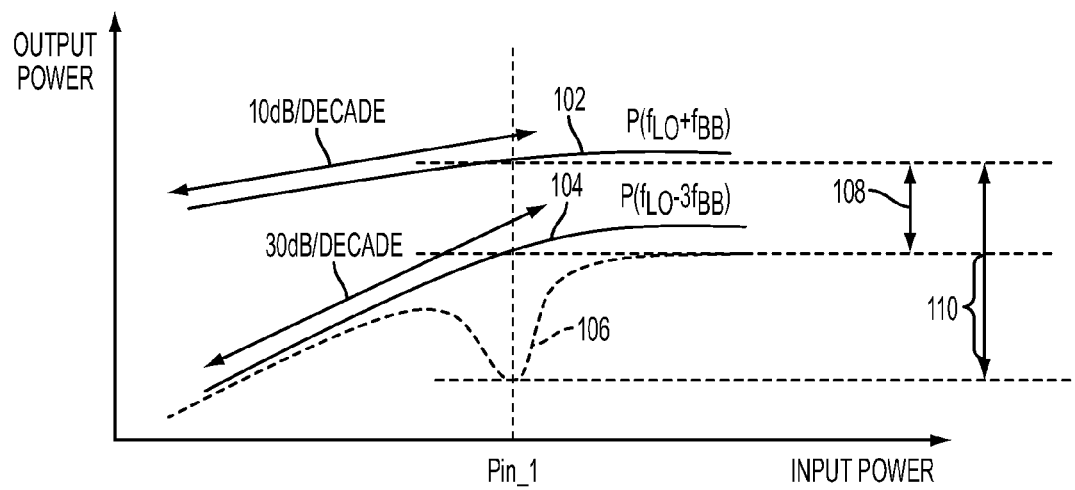
FIG. 1 is a plot showing input power vs. output power for an exemplary up-conversion mixer according to some embodiments.

FIG. 1 is a plot showing input power vs. output power for an exemplary up-conversion mixer according to some embodiments. The up-conversion term at the local oscillator frequency ($f_{LO}$) plus the baseband signal frequency ($f_{BB}$), i.e., at ($f_{LO}+f_{BB}$), has an output power plot 102 that has a 10 dB/decade slope at lower input power and then becomes relatively flat at higher input power.

The third order harmonic term at ($f_{LO}-3f_{BB}$) of an exemplary conventional up-conversion mixer has an output power plot 104 that has a 30 dB/decade slope at lower input power and then becomes relatively flat at higher input power. The third order distortion suppression (of output signal power) $P_{3d}$, i.e., P($f_{LO}+f_{BB}$)−P($f_{LO}-3f_{BB}$), has the value 108 at an input power Pin_1. With higher input power, the output power is higher, but $P_{3d}$ is reduced. With lower input power, the $P_{3d}$ improves (increases), but the output power is lower, which may require a higher gain power amplifier stage to boost the output power.

The third order harmonic term at ($f_{LO}-3f_{BB}$) of an exemplary up-conversion mixer shows an output power plot 106 having a notch (local minimum, or null close to zero) at the input power Pin_1 on the higher output power side (relatively flat part of the curve 106). Therefore, the $P_{3d}$ of the exemplary up-conversion mixer improves (increases) by the difference 110 compared to the conventional up-conversion mixer having the $P_{3d}$ value 108. This allows an improved $P_{3d}$ and a relatively high output power at the same time for a relatively high power input signal, thus reducing the power requirement/consumption of the power amplifier of the output signal. The details of the exemplary up-conversion mixer are described below.

Figure 2:
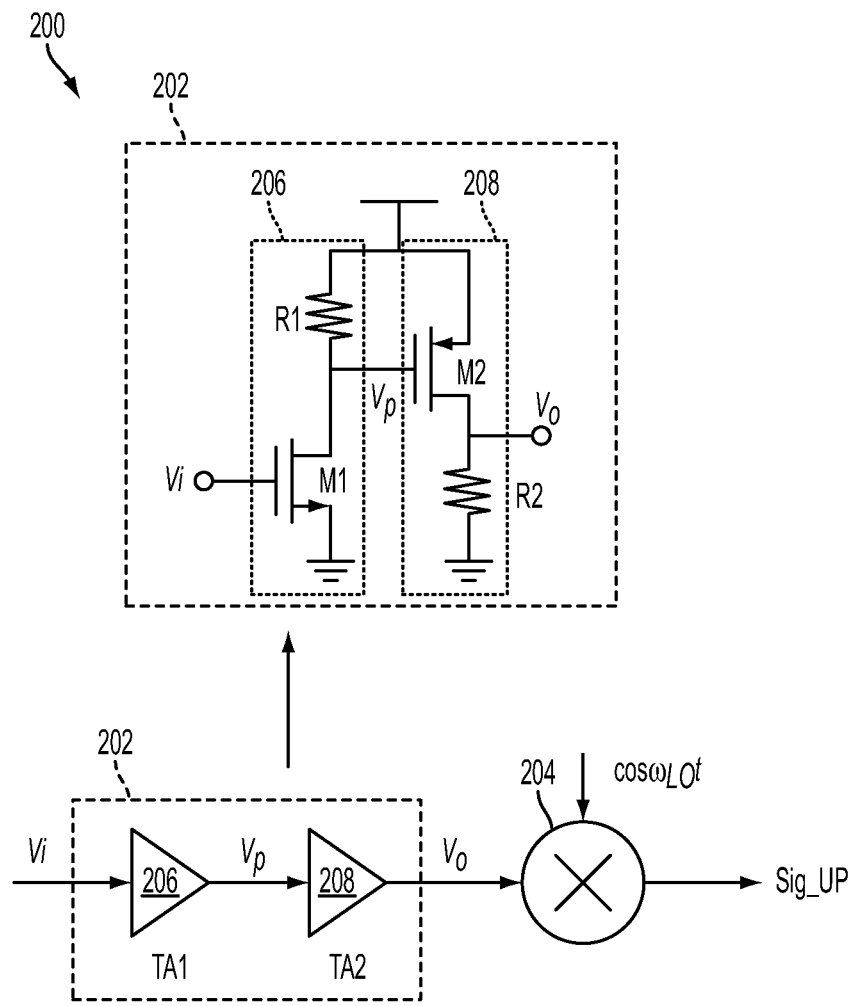
FIG. 2 is a schematic diagram showing an exemplary up-conversion mixer according to some embodiments.

FIG. 2 is a schematic diagram showing an exemplary up-conversion mixer according to some embodiments. An up-conversion mixer circuit 200 has a cascaded transconductance amplifier 202 as an input stage that is coupled to a mixer 204. The mixer 204 multiplies the signal from the cascaded transconductance amplifier 202 with a local oscillator signal, e.g., $\cos W_{LO}t$ to provide an up-converted signal Sig_up. The mixer 204 can be implemented with a Gilbert mixer cell, for example. The cascaded transconductance amplifier 202 includes transconductance amplifiers TA1 206 and TA2 208 coupled together. TA1 206 includes an NMOS transistor M1, and a load transistor R1. TA2 208 includes a PMOS transistor M2, and a load transistor R2. In some embodiments, TA1 206 may include a PMOS transistor instead of the NMOS transistor M1, and an active device load instead of the resistor R1. In some embodiments TA1 208 may include an NMOS transistor instead of the PMOS transistor M2, and an active device load instead of the resistor R2. A voltage Vi is an input voltage signal, Vp is an output voltage signal from TA1 206, which is an input voltage signal to TA2 208. A voltage Vo is an output voltage signal from TA2 208.

Assigning the drain current signal of the NMOS transistor M1 as $id_1$, and the drain current signal of the NMOS transistor M2 as $id_2$, $id_1$ and $id_2$ are described by the following Equation (1).

$$id_1 = gm_1 v_{gs1} + gm_2 v_{gs1}^2 + \ldots \quad id_2 = gm_1' v_{gs2} + gm_2' v_{gs2}^2 + gm_3' v_{gs2}^3 + \ldots \quad V_i = v_{gs1}; V_p = V_{gs2} = id_1 * R_1;$$
$$V_o = id_2 * R_2 \qquad \text{Equation (1)}$$

where $v_{gs1}$ is the source-gate voltage of the NMOS transistor M1, $gm_i$, is the i-th transconductance coefficients of the NMOS transistor M1, i is a positive integer, $v_{gs2}$ is the source-gate voltage of the PMOS transistor M2, $gm_j'$ is the j-th transconductance coefficients of the PMOS transistor M2, j is a positive integer.

The output voltage $V_o$ of the cascaded transconductance amplifier 202 can be described by the following Equation (2):

$$V_o \sim (gm_1' v_{gs2} + gm_2' v_{gs2}^2 + gm_3' v_{gs2}^3) R_2$$

$$V_p = v_{gs2} \sim (gm_1 v_{gs1} + gm_2 v_{gs1}^2) R_1$$

$$V_o = \left[ \begin{array}{c} gm_1' R_1 (gm_1 v_{gs1} + gm_2 v_{gs1}^2) + gm_2' R_1^2 (gm_1 v_{gs1} + gm_2 v_{gs1}^2)^2 + \\ gm_3' R_1^3 (gm_1 v_{gs1} + gm_2 v_{gs1}^2)^3 \end{array} \right] R_2$$

$$= gm_1' R_1 R_2 (gm_1 v_{gs1} + gm_2 v_{gs1}^2) + gm_2' R_1^2 R_2 (gm_1 v_{gs1} + gm_2 v_{gs1}^2)^2 +$$

$$gm_3' R_1^3 R_2 (gm_1 v_{gs1} + gm_2 v_{gs1}^2)^3$$

$$= a_1 (b_1 V_i + b_2 V_i^2) + a_2 (b_1 V_i + b_2 V_i^2)^2 + a_3 (b_1 V_i + b_2 V_i^2)^3,$$

where $a_1 = gm_1' R_1 R_2$; $a_2 = gm_2' R_1^2 R_2$; $a_3 = gm_3' R_1^3 R_2$ $b_1 = gm_1$; $b_2 = gm_2$ For $V_i = V_{gs1} = A \cdot \cos w_m t$, the $\cos 3 w_m t$ coefficient is given by $$\frac{1}{4} (2 gm_2' R_1^2 R_2 gm_1 gm_2 + gm_3' R_1^3 R_2 gm_1^3) A^3 + \qquad \text{Equation (3)}$$

$$\frac{15}{16} gm_3' R_1^3 R_2 gm_1 gm_2^2 A^5.$$

For a specific $v_{gs}$ region where $gm_3'$ is smaller than zero, the $\cos 3 w_m t$ coefficient can be reduced, e.g., close to zero or minimized, with a circuit parameter design in the up-conversion mixer circuit 200 such that the coefficient A (the amplitude of the input signal Vi) is given by $$A \sim \sqrt{ \left| \frac{8 gm_2' R_1^2 R_2 gm_1 gm_2 + 4 gm_3' R_1^3 R_2 gm_1^3}{15 gm_3' R_1^3 R_2 gm_1 gm_2^2} \right| }. \qquad \text{Equation (4)}$$

This scheme described above can be referred to as a pre-distortion technique. The cascaded transconductance amplifier 202 reduces the $\cos 3 w_m t$ term's coefficient resulting from the up-conversion mixer circuit 200, thus the third order harmonic term at $(f_{LO} - 3 f_{BB})$ is reduced, improving (increasing) the third order distortion suppression $P_{3d}$.

Figure 3:
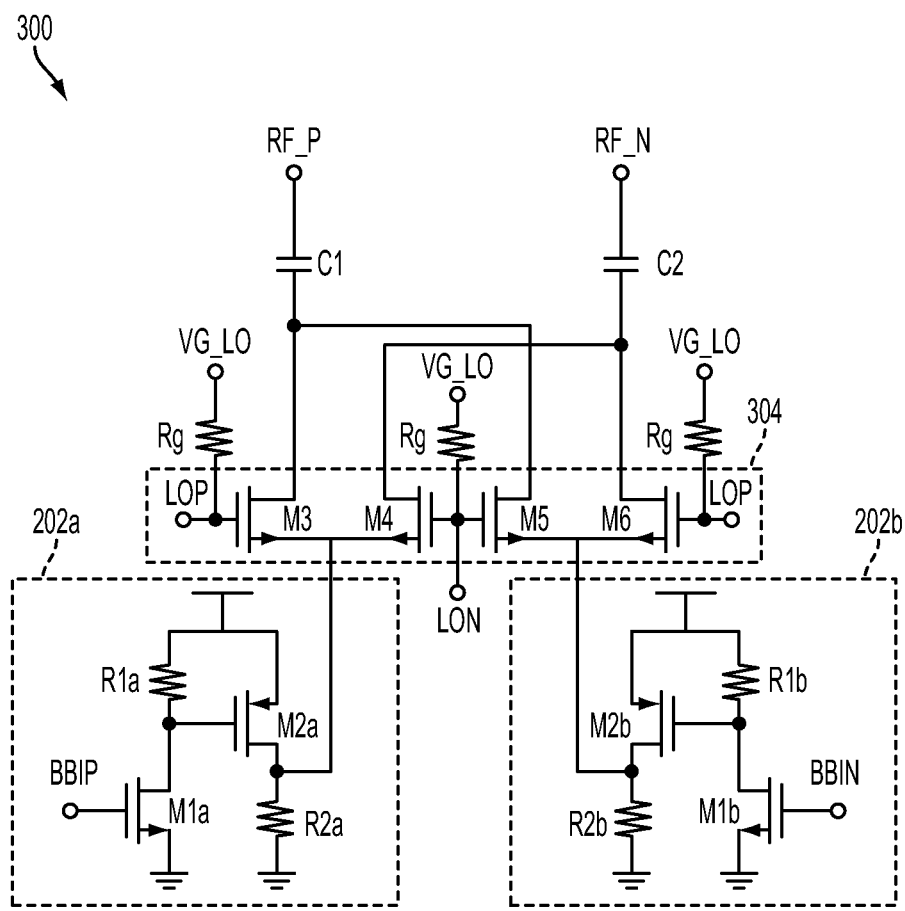
FIG. 3 is a schematic diagram showing an exemplary up-conversion mixer circuit of FIG. 2 according to some embodiments.

FIG. 3 is a schematic diagram showing an exemplary up-conversion mixer circuit of FIG. 2 according to some embodiments. An up-conversion mixer circuit 300 includes input stages 202a and 202b. The input stages 202a and 202b implemented using the cascaded transconductance amplifier 202 in FIG. 2 are coupled to a Gilbert mixer cell 304 that includes NMOS transistors M3, M4, M5, and M6. The input stage 202a includes an NMOS transistor M1a, a PMOS transistor M2a, and load resistors R1a and R2a. The input stage 202b includes an NMOS transistor M1b, a PMOS transistor M2b, and load resistors R1b and R2b. An input signal Vi is coupled across the nodes BBIP and BBIN (gates of NMOS transistors M1a and M1b).

The Gilbert mixer cell 304 is known in the art, and a local oscillator signal is coupled across nodes LOP and LON in the Gilbert mixer cell 304. The nodes LOP and LON are also coupled to a bias voltage VG_LO through a resistor Rg. The up-converted signal output is provided by the nodes RF_P and RF_N. The node RF_P is coupled to the drains of the NMOS transistors M3 and M5 through a coupling capacitor C1. The node RF_N is coupled to the drains of the NMOS transistors M4 and M6 through a coupling capacitor C2.

Because the input stages 202a and 202b (implemented using the cascaded transconductance amplifier 202) reduce the $\cos 3 w_m t$ term's coefficient resulting from the up-conversion mixer circuit 300, the third order harmonic term at $(f_{LO} - 3 f_{BB})$ is reduced, improving (increasing) the third order distortion suppression $P_{3d}$. Also, the up-conversion mixer circuit 300 has more voltage headroom compared to a conventional up-conversion mixer circuit having four stages from a power supply voltage to ground, since the up-conversion mixer circuit 300 has only two stages from a power supply voltage to ground, e.g., R1a and M1a. Thus, the up-conversion mixer circuit 300 can be implemented for a low voltage application.

Figure 4:
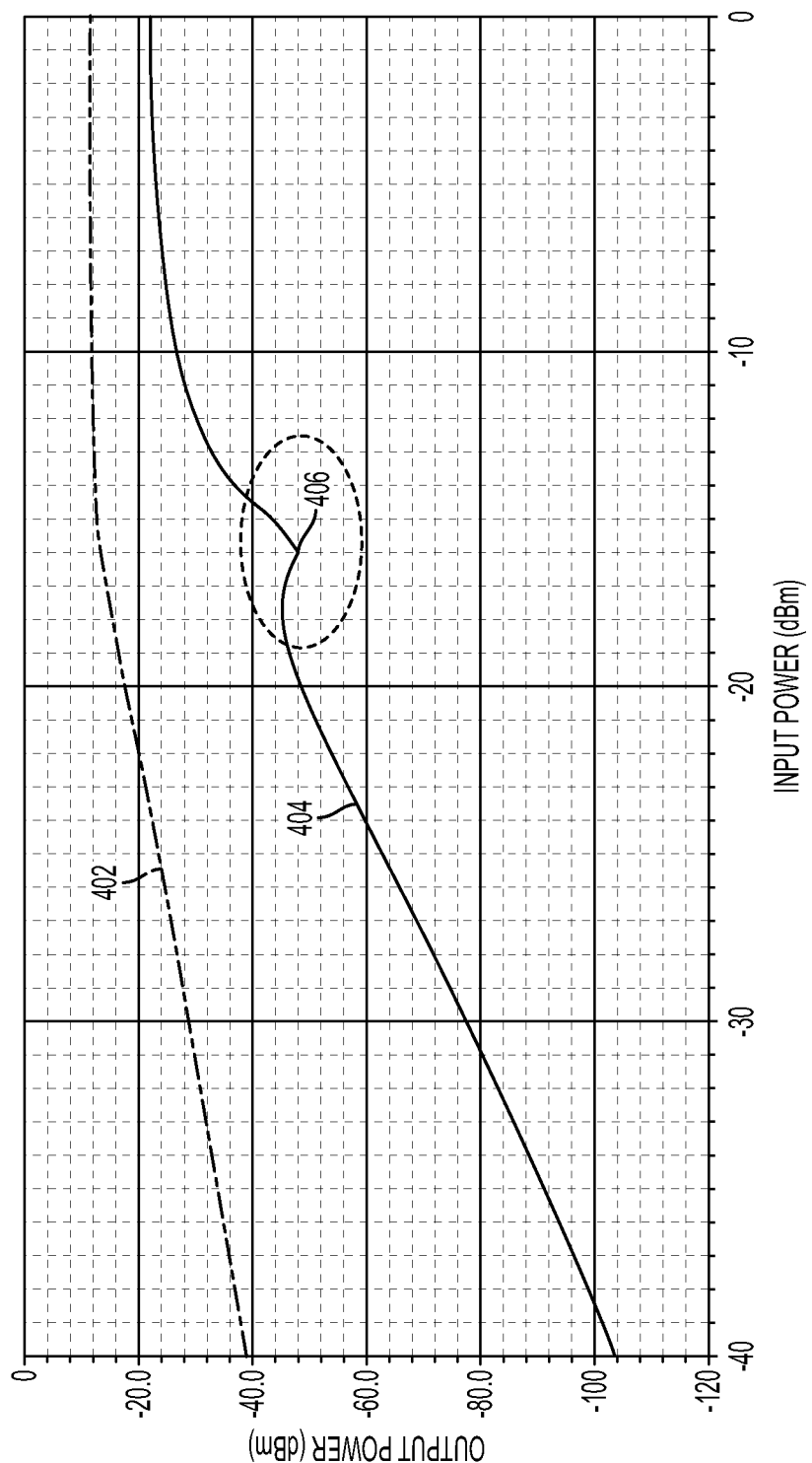
FIG. 4 is a plot showing input power vs. output power of the exemplary up-conversion mixer circuit of FIG. 3 according to some embodiments.

FIG. 4 is a plot showing input power vs. output power of the exemplary up-conversion mixer circuit of FIG. 3 according to some embodiments. The third order harmonic term at $(f_{LO} - 3 f_{BB})$ of the exemplary up-conversion mixer circuit 300 has an output power plot 404 with a notch (local minimum) 406 at the input power −16 dBm. The $P_{3d}$ of the exemplary up-conversion mixer improves (increases) by about 10 dB, compared to a conventional up-conversion mixer without such a notch 406, for the same up-converted term's output power plot 402. This allows an improved $P_{3d}$ and a relatively high output power at the same time, reducing the power requirement/consumption of the power amplifier for the output signal.

Figure 5:
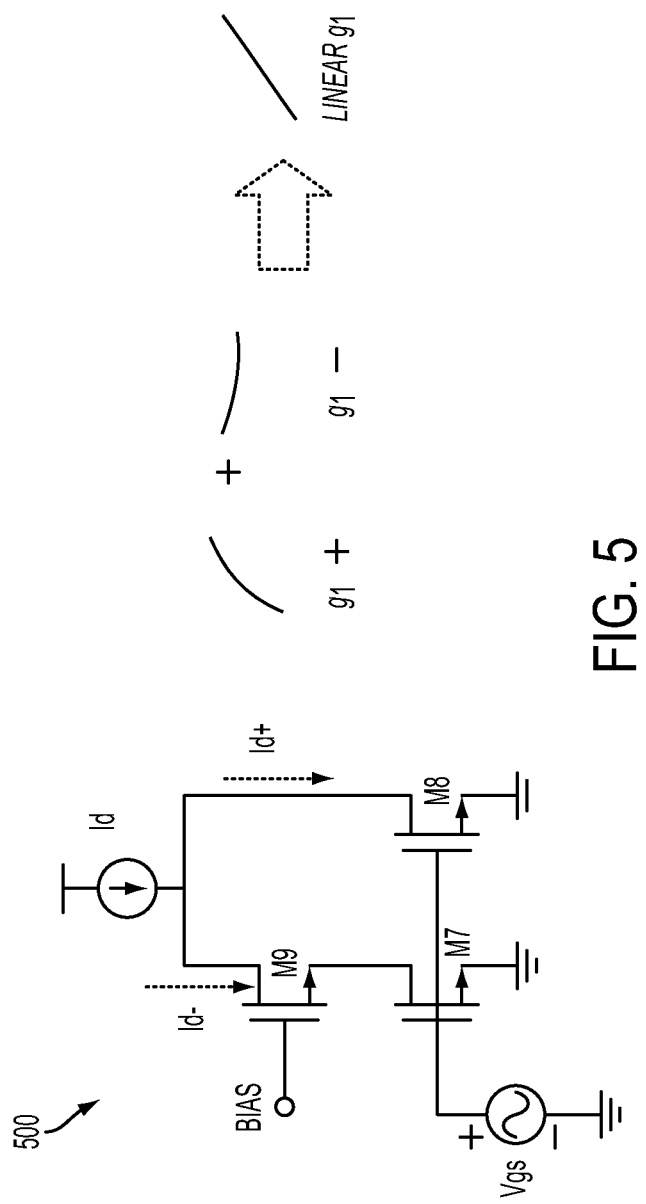
FIG. 5 is a schematic diagram showing an exemplary linear transconductance amplifier for an up-conversion mixer according to some embodiments.

FIG. 5 is a schematic diagram showing an exemplary linear transconductance amplifier for an up-conversion mixer according to some embodiments. The linear transconductance amplifier 500 is a transconductance amplifier that can be used as an input stage to a mixer. The linear transconductance amplifier 500 includes NMOS transistors M7, M8, and M9, a bias voltage BIAS for the gate of the NMOS transistor M9, and a voltage input signal $v_{gs}$, for the gates of the NMOS transistors M7 and M8. In other embodiments, an input signal can be coupled across the gates of the NMOS transistors M7 and M9 with a built-in bias voltage level. The NMOS transistor M7 operates in a triode (or linear) region. The drains of the NMOS transistors M9 and M8 are coupled to a current source Id.

For a transconductance amplifier with a voltage input signal $v_{gs}$ and an output current signal id, the output current and transconductance coefficients $g_k$ (the k-th transconductance coefficient, k is a positive integer) are described by the following Equation (5).

$$i_d = g_1 v_{gs} + g_2 v_{gs}^2 + g_3 v_{gs}^3 + \ldots \qquad \text{Equation (5)}$$

$$g_1 = \frac{d i_d}{d v_{gs}}; \quad g_2 = \frac{1}{2} \frac{d^2 i_d}{d v_{gs}^2}; \quad g_3 = \frac{1}{6} \frac{d^3 i_d}{d v_{gs}^3}.$$

If the first transconductance coefficient $g_1$ is linear with respect to the input signal $v_{gs}$, $g_2$ is a constant, and $g_3$ is zero. Accordingly, the third order harmonic term at $(f_{LO} - 3 f_{BB})$ is reduced (or minimized), e.g., close to zero.

With the drain current signal of the NMOS transistor M9 as id−, and the drain current signal of the NMOS transistor M8 as id+, the $g_1$ coefficient for the NMOS transistors M7, i.e., $g_{1-}$, is negative, while the $g_1$ coefficient for the NMOS transistors M8, i.e., $g_{1+}$, is positive. Therefore, the combined $g_1$ coefficient for the linear transconductance amplifier 500 can be made linear. Because $g_1$ is linear with respect to $v_{gs}$, $g_2$ is a constant, and $g_3$ is zero according to Equation (5). Thus, the third order harmonic term at $(f_{LO} - 3 f_{BB})$ is reduced (or minimized), e.g., close to zero.

More detailed description regarding the linearity of the linear transconductance amplifier 500 can be found in "A 2 GHz 16 dBm IIP3 low noise amplifier in 0.25 μm CMOS technology" (by Y. S. Youn, J. H. Chang, K. J. Koh, Y. J. Lee, and H. K. Yu, in IEEE Int. Solid-State Circuits Conf., San Francisco, Calif., pp. 452-453, February 2003), which is incorporated herein by reference in its entirety. While the exemplary linear transconductance amplifier 500 is implemented using NMOS transistors M7, M8, and M9, a person skilled in the art will appreciate that PMOS transistors can be used in some other embodiments.

Figure 6:
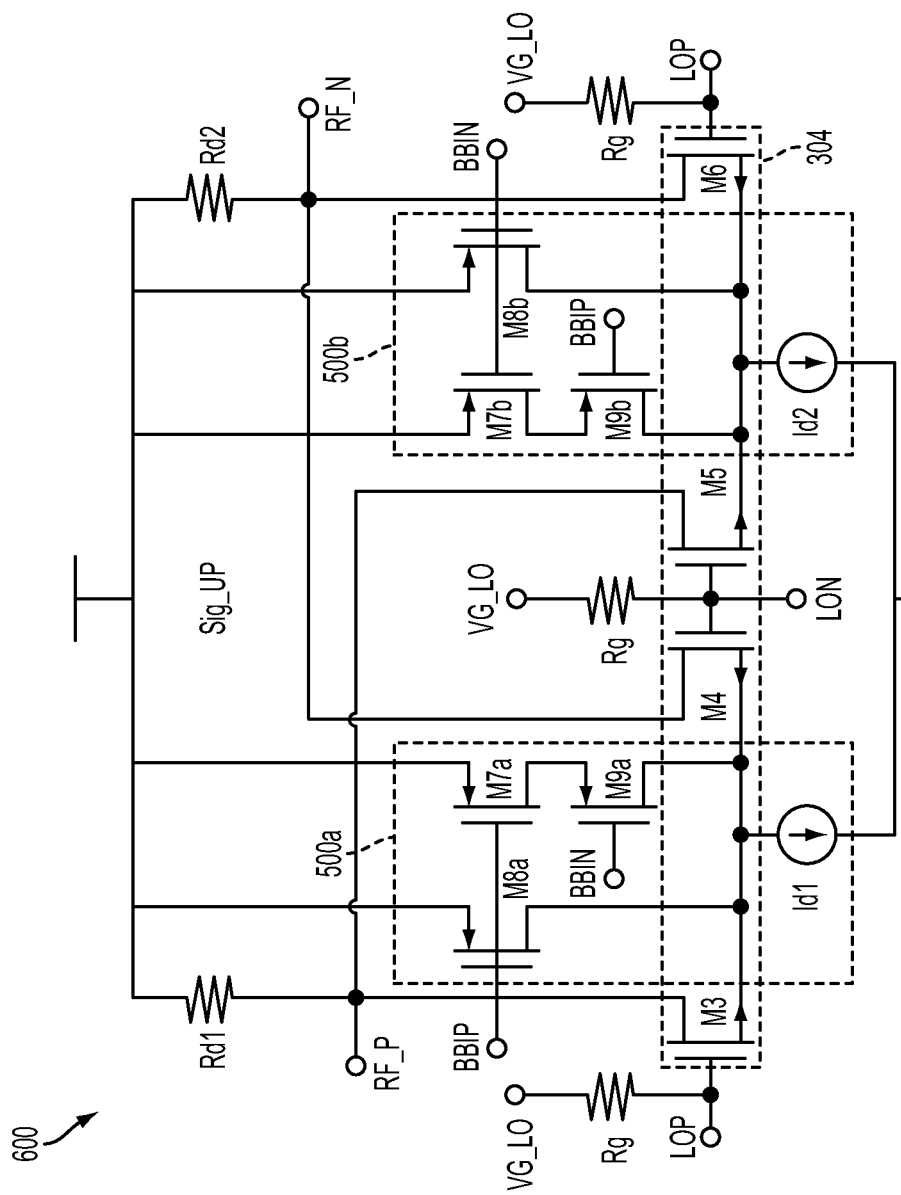
FIG. 6 is a schematic diagram showing an exemplary up-conversion mixer circuit with the linear transconductance of amplifier FIG. 5 according to some embodiments.

FIG. 6 is a schematic diagram showing an exemplary up-conversion mixer circuit with the linear transconductance amplifier of FIG. 5 according to some embodiments. An up-conversion mixer circuit 600 includes input stages 500a and 500b. The input stages 502a and 502b implemented using the linear transconductance amplifier 500 are coupled to the Gilbert mixer cell 304 that includes NMOS transistors M3, M4, M5, and M6. The input stage 500a includes PMOS transistors M7a, M8a, and M9a, and a current source Id1. The input stage 500b includes PMOS transistors M7b, M8b, and M9b, and a current source Id2. An input signal Vi is coupled across the nodes BBIP (gates of PMOS transistors M7a and M8a) and BBIN (gates of PMOS transistors M7b and M8b).

The Gilbert mixer cell 304 is known in the art, and a local oscillator signal is coupled across nodes LOP and LON in the Gilbert mixer cell 304. The nodes LOP and LON are also coupled to a bias voltage VG_LO through a resistor Rg. The up-converted signal output is provided by the nodes RF_P and RF_N. The node RF_P is coupled to the drains of the NMOS transistors M3 and M5. The node RF_N is coupled to the drains of the NMOS transistors M4 and M6.

Because the input stages 500a and 500b (implemented using the linear transconductance amplifier 500) have the $g_1$ coefficient linear with respect to input signal, the $g_3$ coefficient is zero, and the third order harmonic term at $(f_{LO}-3f_{BB})$ of the up-conversion mixer circuit 600 is reduced (or minimized), e.g., close to zero. Thus, the third order distortion suppression $P_{3d}$ is improved (increased). Also, the up-conversion mixer circuit 600 has more voltage headroom compared to a conventional up-conversion mixer circuit having four stages from a power supply to ground, since the up-conversion mixer circuit 600 has only three stages from a power supply voltage to ground, e.g., M7a, M9a, and Id1. Thus, the up-conversion mixer circuit 600 can be implemented for a low voltage application.

Figure 7:
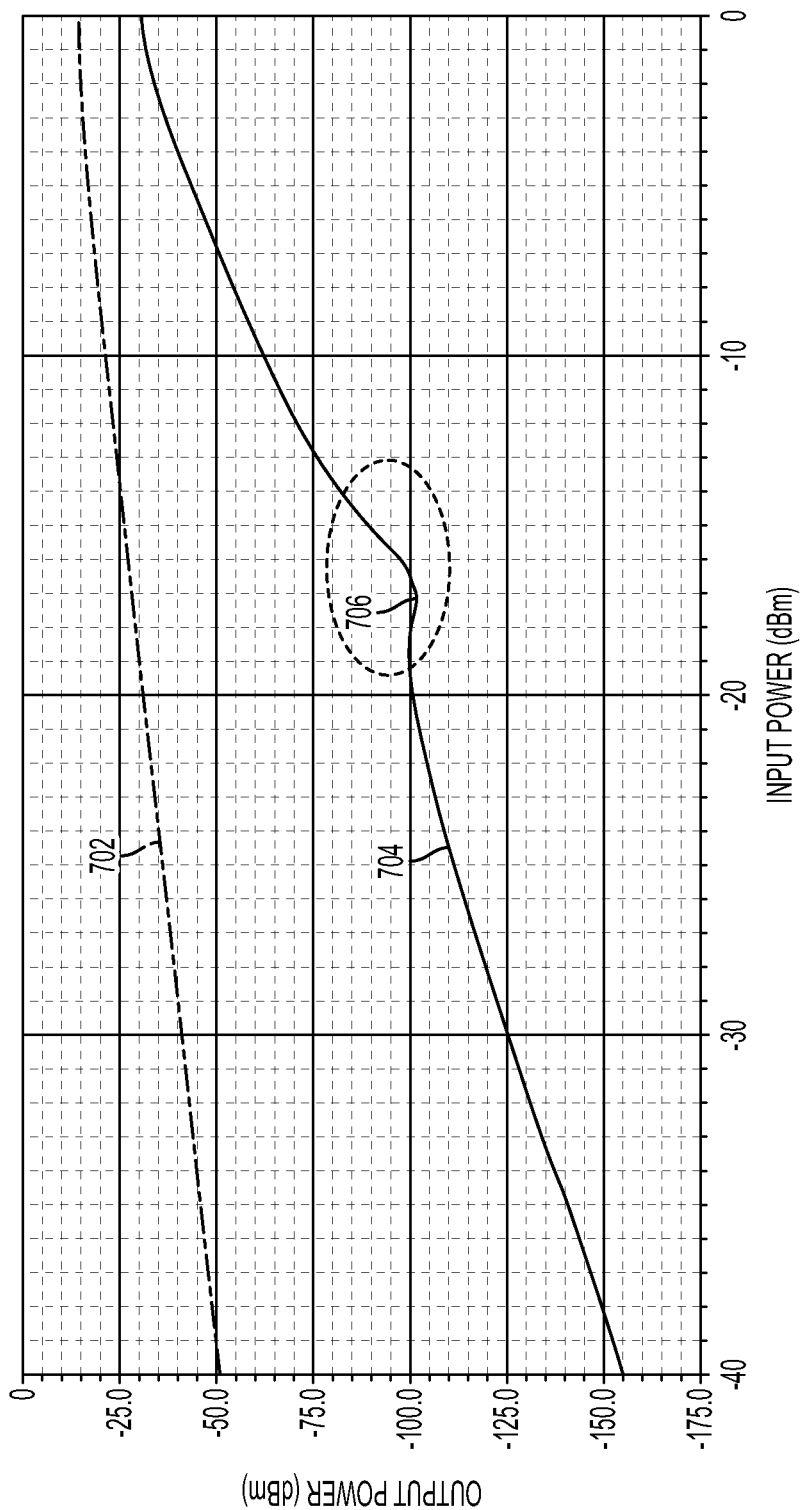
FIG. 7 is a plot showing input power vs. output power of the exemplary up-conversion mixer circuit of FIG. 6 according to some embodiments.

FIG. 7 is a plot showing input power vs. output power of the exemplary up-conversion mixer circuit of FIG. 6 according to some embodiments. The third order harmonic term at $(f_{LO}-3f_{BB})$ of the exemplary up-conversion mixer circuit 600 has an output power plot 704 with a notch (local minimum) 706 at the input power −17 dBm. The $P_{3d}$ of the exemplary up-conversion mixer improves (increases) by about 10 dB, compared to a conventional up-conversion mixer without such a notch 706, for the same up-converted term's output power plot 702. This allows an improved $P_{3d}$ and a relatively high output power at the same time, reducing the power requirement/consumption of the power amplifier for the output signal.

Figure 8:
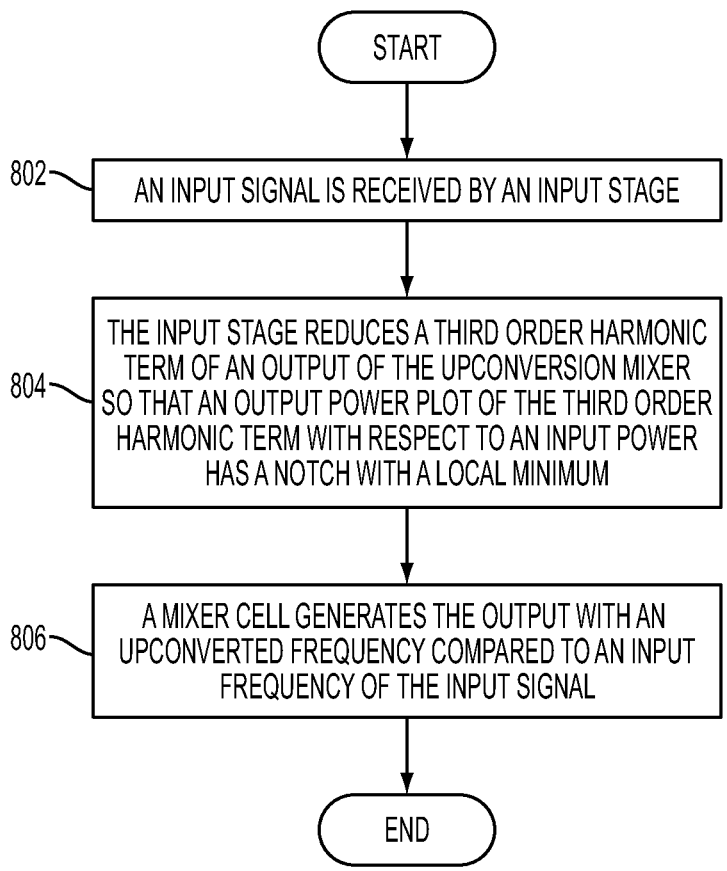
FIG. 8 is a flowchart for a method of the exemplary up-conversion mixer circuits in FIG. 3 and/or FIG. 6 according to some embodiments.

FIG. 8 is a flowchart for a method of the exemplary up-conversion mixer circuits in FIG. 3 and/or FIG. 6 according to some embodiments. At step 802, an input signal is received by an input stage. At step 804, the input stage reduces a third order harmonic term of an output of the up-conversion mixer so that an output power plot of the third order harmonic term with respect to an input power has a notch with a local minimum. At step 806, a mixer cell generates the output with an up-converted frequency compared to an input frequency of the input signal.

In various embodiments, the mixer cell implemented with a Gilbert mixer cell, and a local oscillator signal is supplied to the mixer cell for up-converting the input signal. The input stage reduces a third order harmonic term by cascading two transconductance amplifiers. A first gate of an NMOS transistor is coupled to the input signal. A first drain of the NMOS transistor is coupled to a second gate of a PMOS transistor. A second drain of the PMOS transistor is coupled to the mixer cell.

In various embodiments, the input stage reduces a third order harmonic term by a linear transconductance amplifier in the input stage having a linear first transconductance coefficient with respect to the input signal. The input stage reduces a third order harmonic term by combining a positive first transconductance coefficient and a negative first transconductance coefficient.

According to some embodiments, an up-conversion mixer includes a mixer cell having an output node arranged to provide an output. An input stage is coupled to the mixer cell and arranged to receive an input signal. The mixer cell is configured to generate the output with an up-converted frequency compared to an input frequency of the input signal. The input stage is configured to reduce a third order harmonic term of the output so that an output power plot of the third order harmonic term with respect to an input power has a notch with a local minimum.

According to some embodiments, a method of up-converting an input signal using an up-conversion mixer includes receiving an input signal by an input stage. The input stage reduces a third order harmonic term of an output of the up-conversion mixer so that an output power plot of the third order harmonic term with respect to an input power has a notch with a local minimum. A mixer cell generates the output with an up-converted frequency compared to an input frequency of the input signal.

One aspect of this description relates to an up-conversion mixer. The up-conversion mixer includes a mixer cell having at least one output node configured to generate an output. The up-conversion mixer further includes a first cascaded transconductance input stage coupled to the mixer cell, the first cascaded transconductance input stage configured to receive an input signal and to reduce a third order harmonic of the output. The up-conversion mixer further includes a second cascaded transconductance input stage coupled to the mixer cell, the second cascaded transconductance input stage configured to receive the input signal and to reduce a third order harmonic of the output.

Another aspect of this description relates to an up-conversion mixer including a mixer cell having at least one output node configured to generate an output. The up-conversion mixer further includes a first linear transconductance input stage coupled to the mixer cell, the first linear transconductance input stage configured to receive an input signal and to reduce a third order harmonic of the output. The up-conversion mixer further includes a second linear transconductance input stage coupled to the mixer cell, the second linear transconductance input stage configured to receive the input signal and to reduce a third order harmonic of the output.

Still another aspect of this description relates to a method of using an up-conversion mixer. The method includes receiving an input signal using a first transconductance input stage and generating a first transconductance signal. The method further includes receiving the input signal using a second transconductance input stage and generating a second transconductance signal. The method further includes receiving the first transconductance signal and the second transconductance signal using a mixer cell. The method further includes reducing a third order harmonic term of an output of the mixer cell, using the first transconductance input stage and the second transconductance input stage and outputting the output using the mixer cell.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An up-conversion mixer, comprising:
   a mixer cell having at least one output node configured to generate an output;
   a first cascaded transconductance input stage coupled to the mixer cell, the first cascaded transconductance input stage configured to receive an input signal and to reduce a third order harmonic of the output; and
   a second cascaded transconductance input stage coupled to the mixer cell, the second cascaded transconductance input stage configured to receive the input signal and to reduce the third order harmonic of the output,
   wherein the third order harmonic is reduced to have a first magnitude at a first input signal power level smaller than a second magnitude at a second input signal power level, the second input signal power level being lower than the first input signal power level.

2. The up-conversion mixer of claim 1, wherein at least one of the first cascaded transconductance input stage or the second cascaded transconductance input stage comprises:
   a first transistor configured to receive the input signal, the first transistor connected to a ground and to a first node;
   a first resistor connected to the first node and to a supply voltage, wherein the first node is between the first transistor and the first resistor;
   a second transistor configured to receive a voltage of the first node, the second transistor connected to the supply voltage and to a second node; and
   a second resistor connected to the second node and to the ground, wherein the second node is between the second transistor and the second resistor, and the second node is connected to the mixer cell.

3. The up-conversion mixer of claim 1, wherein the mixer cell comprises:
   a first transistor configured to receive a local oscillation signal, the first transistor connected to a first node coupled to the first cascaded transconductance input stage;
   a second transistor configured to receive the local oscillation signal, the second transistor connected to the first node, wherein the first node is between the first transistor and the second transistor;
   a third transistor configured to receive the local oscillation signal, the third transistor connected to a second node coupled to the second cascaded transconductance input stage; and
   a fourth transistor configured to receive the local oscillation signal, the fourth transistor connected to the second node, wherein the second node is between the third transistor and the fourth transistor.

4. The up-conversion mixer of claim 3, wherein the at least one output node comprises:
   a first output node connected to the first transistor and the fourth transistor; and
   a second output node connected to the second transistor and the third transistor.

5. The up-conversion mixer of claim 4, further comprising:
   a first capacitor between the first output node and the first transistor; and
   a second capacitor between the second output node and the third transistor.

6. The up-conversion mixer of claim 1, wherein the mixer cell is configured to receive a bias voltage.

7. The up-conversion mixer of claim 2, wherein the first transistor is an n-channel metal oxide semiconductor (NMOS) transistor and the second transistor is a p-channel metal oxide semiconductor (PMOS) transistor.

8. An up-conversion mixer, comprising:
   a mixer cell having at least one output node configured to generate an output;
   a first linear transconductance input stage coupled to the mixer cell, the first linear transconductance input stage configured to receive an input signal and to reduce a third order harmonic of the output; and
   a second linear transconductance input stage coupled to the mixer cell, the second linear transconductance input stage configured to receive the input signal and to reduce the third order harmonic of the output,
   wherein the third order harmonic is reduced to have a first magnitude at a first input signal power level smaller than a second magnitude at a second input signal power level, the second input signal power level being lower than the first input signal power level.

9. The up-conversion mixer of claim 8, wherein at least one of the first linear transconductance input stage or the second linear transconductance input stage comprises:
   a first transistor configured to receive an input signal and a supply voltage, the first transistor connected to the mixer cell and a current supply, wherein the first transistor has a positive g1 coefficient;
   a second transistor configured to receive the input signal and the supply voltage, wherein the second transistor has a negative g1 coefficient; and
   a third transistor configured to receive the input signal, the third transistor connected to the mixer cell and the current supply.

10. The up-conversion mixer of claim 9, wherein the third transistor is connected between the mixer cell and the second transistor.

11. The up-conversion mixer of claim 9, wherein a gate of the first transistor is connected to a gate of the second transistor.

12. The up-conversion mixer of claim 8, wherein the mixer cell comprises:
- a first transistor configured to receive a local oscillation signal, the first transistor connected to a first node coupled to the first linear transconductance input stage;
- a second transistor configured to receive the local oscillation signal, the second transistor connected to a second node coupled to the first linear transconductance input stage, wherein the second node is different from the first node, and the first node and the second node are between the first transistor and the second transistor;
- a third transistor configured to receive the local oscillation signal, the third transistor connected to a third node coupled to the second linear transconductance input stage; and
- a fourth transistor configured to receive the local oscillation signal, the fourth transistor connected to a fourth node coupled to the second linear transconductance input stage, wherein the fourth node is different from the third node, and the third node and the fourth node are between the third transistor and the fourth transistor.

13. The up-conversion mixer of claim 12, wherein the at least one output node comprises:
- a first output node connected to the first transistor and the fourth transistor; and
- a second output node connected to the second transistor and the third transistor.

14. The up-conversion mixer of claim 8, wherein the mixer cell is configured to receive a bias voltage.

15. A method of using an up-conversion mixer, the method comprising:
- receiving an input signal using a first transconductance input stage;
- generating a first transconductance signal;
- receiving the input signal using a second transconductance input stage;
- generating a second transconductance signal;
- receiving the first transconductance signal and the second transconductance signal using a mixer cell;
- reducing a third order harmonic term of an output of the mixer cell, using the first transconductance input stage and the second transconductance input stage, wherein the third order harmonic is reduced to have a first magnitude at a first input signal power level smaller than a second magnitude at a second input signal power level, the second input signal power level being lower than the first input signal power level; and
- outputting the output using the mixer cell.

16. The method of claim 15, wherein generating the first transconductance signal comprises using a first cascaded transconductance input stage, and generating the second transconductance signal comprises using a second cascaded transconductance input stage.

17. The method of claim 15, wherein generating the first transconductance signal comprises using a first linear transconductance input stage, and generating the second transconductance signal comprises using a second linear transconductance input stage.

18. The method of claim 15, wherein reducing the third order harmonic comprises:
- generating the first transconductance signal using a first transistor having a positive g1 coefficient and a second transistor having a negative g1 coefficient; and
- generating the second transconductance signal using a third transistor having a positive g1 coefficient and a fourth transistor having a negative g1 coefficient.

19. The method of claim 15, further comprising biasing the mixer cell.

20. The method of claim 15, wherein reducing the third order harmonic comprises using a pre-distortion technique.

* * * * *